US010921713B2

(12) United States Patent
Muta et al.

(10) Patent No.: US 10,921,713 B2
(45) Date of Patent: Feb. 16, 2021

(54) DEVELOPING METHOD, COMPUTER-READABLE STORAGE MEDIUM AND DEVELOPING APPARATUS

(71) Applicant: TOKYO ELECTRON LIMITED, Tokyo (JP)

(72) Inventors: Koshi Muta, Koshi (JP); Hideharu Kyoda, Koshi (JP); Minoru Kubota, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/560,137

(22) Filed: Sep. 4, 2019

(65) Prior Publication Data
US 2019/0391496 A1  Dec. 26, 2019

Related U.S. Application Data

(62) Division of application No. 14/953,109, filed on Nov. 27, 2015, now Pat. No. 10,459,340.

(30) Foreign Application Priority Data

Dec. 1, 2014  (JP) ................................ 2014-243139
Oct. 29, 2015 (JP) ................................ 2015-212830

(51) Int. Cl.
*G03F 7/30* (2006.01)
*B05D 1/00* (2006.01)
(Continued)

(52) U.S. Cl.
CPC ............ *G03F 7/3021* (2013.01); *B05C 11/08* (2013.01); *B05D 1/005* (2013.01); *H01L 21/6715* (2013.01)

(58) Field of Classification Search
None
See application file for complete search history.

(56) References Cited

U.S. PATENT DOCUMENTS 6,265,323 B1   7/2001  Nakamura et al.
2005/0058775 A1  3/2005  Oku et al.
(Continued)

FOREIGN PATENT DOCUMENTS

CN   102043354 A   5/2011
JP   S60217627 A   10/1985
(Continued)

*Primary Examiner* — Michael P. Rodriguez
(74) *Attorney, Agent, or Firm* — Nath, Goldberg & Meyer; Jerald L. Meyer

(57) ABSTRACT

A developing method includes: forming a liquid pool of a diluted developing solution diluted with pure water in a central portion of a substrate; forming a liquid film of the diluted developing solution on a surface of the substrate by accelerating rotation of the substrate to diffuse the liquid pool of the diluted developing solution on the entire surface of the substrate; and then supplying a developing solution onto the substrate. Supplying a developing solution includes: supplying the developing solution from a developing solution supply nozzle having a liquid contact surface while securing a gap having a predetermined size between the developing solution supply nozzle and the substrate; and moving the developing solution supply nozzle in a radial direction passing through a center of the substrate while forming a liquid pool of the developing solution between the substrate and the liquid contact surface of the developing solution supply nozzle.

5 Claims, 16 Drawing Sheets

(51) Int. Cl.
*B05C 11/08* (2006.01)
*H01L 21/67* (2006.01)

(56) References Cited

U.S. PATENT DOCUMENTS

| | | |
|---|---|---|
| 2010/0130022 A1 | 5/2010 | Park et al. |
| 2011/0096304 A1* | 4/2011 | Takeguchi ............ G03F 7/3021 355/27 |
| 2013/0194557 A1 | 8/2013 | Yamamoto et al. |
| 2016/0154311 A1 | 6/2016 | Muta et al. |
| 2017/0205712 A1 | 7/2017 | Chou |

FOREIGN PATENT DOCUMENTS

| | | |
|---|---|---|
| JP | 11204401 A | 7/1999 |
| JP | 2000195773 A | 7/2000 |
| JP | 2001319861 A | 11/2001 |
| JP | 3614769 B2 | 11/2004 |
| JP | 4893799 B2 | 1/2012 |
| JP | 201553467 A | 3/2015 |
| KR | 20010058399 A | 7/2001 |
| WO | 2006043253 A2 | 4/2006 |

\* cited by examiner

DEVELOPING METHOD, COMPUTER-READABLE STORAGE MEDIUM AND DEVELOPING APPARATUS

CROSS-REFERENCE TO RELATED APPLICATION

This is a Divisional Application of U.S. patent application Ser. No. 14/953,109, filed Nov. 27, 2015, claiming benefit from Japanese Patent Application Nos. 2014-243139 and 2015-212830, filed on Dec. 1, 2014 and Oct. 29, 2015, respectively, in the Japan Patent Office, the disclosures of which are incorporated herein in their entirety by reference.

TECHNICAL FIELD

The present disclosure relates to a developing method for developing a substrate, on which a resist film is formed, and forming a predetermined pattern on the substrate, a computer-readable storage medium and a developing apparatus.

BACKGROUND

For example, in a photolithography process of a semiconductor device manufacturing process, a predetermined resist pattern is formed on a wafer by sequentially performing, for example, a resist coating process of coating a resist liquid on a semiconductor wafer (hereinafter referred to as a "wafer") as a substrate to form a resist film, an exposure process of exposing a predetermined pattern in the resist film, a heating process (post-exposure baking process) of promoting a chemical reaction within the resist film after the exposure, a developing process of developing the exposed resist film, and so forth.

As developing methods, there are known a method of, while supplying a developing solution from a long nozzle having a length substantially equal to a diameter of a wafer, parallel-moving the nozzle from one end portion of the wafer toward the other end portion thereof, and a method of supplying a developing solution onto a wafer rotating at a high speed and diffusing the developing solution.

However, when the developing process is performed by the long nozzle, a difference in the developing solution contact time is generated in one end portion and the other end portion of the wafer. Furthermore, even when the developing solution is supplied to the center of the rotating wafer, a difference in the developing solution contact time is generated in the central portion of the wafer and the outer peripheral portion thereof. As a result, a variation in the line width of the resist pattern subjected to the developing process is generated within a wafer plane. Along with the recent miniaturization of a resist pattern attributable to the high integration of a semiconductor device, the variation in the line width caused by the difference in the developing time has become impermissible.

Thus, in order to uniformly perform a developing process within a wafer plane, study has been made on a method of using a developing solution supply nozzle (hereinafter often referred to as a "PAD nozzle") having a liquid contact surface, for example, parallel to a substrate. Specifically, a developing solution is first supplied onto a substrate, which is not rotating, while securing a gap of a predetermined size between the liquid contact surface of the developing solution supply nozzle and the wafer, thereby forming a liquid film of the developing solution between the developing solution supply nozzle and the wafer. At this time, the developing solution supply nozzle is positioned in the central portion of the substrate. Then, the wafer is rotated at a low speed of about 30 rpm. While continuing to supply the developing solution from the developing solution supply nozzle, namely while maintaining the liquid film of the developing solution between the developing solution supply nozzle 300 and the substrate, the developing solution supply nozzle 300 is moved to the outer peripheral portion of the wafer W as illustrated in FIG. 25. This makes it possible to supply the developing solution Q onto the entire surface of the wafer W and to realize a uniform developing process within a wafer plane.

From the viewpoint of improving the throughput of wafer processing, it is preferred that the developing time is as short as possible. However, according to the study conducted by the present inventors, it was confirmed that if the developing time is made short in a developing process which makes use of a PAD nozzle, the points at which the line width of a resist pattern does not become a desired value are spirally generated within a wafer plane, for example, as illustrated in FIG. 26. In FIG. 26, the line width of a resist pattern within a wafer plane is measured at multiple points on a shot-by-shot basis and the degree of variation in the line width in each shot is illustrated by color shading. In addition, FIG. 26 illustrates a case where the developing time is, for example, 30 seconds. However, it was confirmed that, if the developing time is 60 seconds, as illustrated in FIG. 27, the tendency to become spiral is scarcely seen and the line width within the wafer plane is substantially uniform.

SUMMARY

Some embodiments of the present disclosure provide a developing method and a developing apparatus capable of improving the throughput of a developing process while securing the in-plane uniformity of the developing process.

The present inventors have made extensive investigation on the causes of variation in the line width spirally generated when the developing time is shortened. As a result, the present inventors have found that the spiral shape illustrated in FIG. 26 is attributable to the dissolved product generated at an initial stage of development. Furthermore, the reason why the tendency of the spiral shape is not generated when the developing time is about 60 seconds as mentioned above is considered to be that the developing time is sufficiently secured and the influence of the dissolved product is relatively small.

The present disclosure is based on this finding. According to the present disclosure, a liquid pool of a diluted developing solution is first formed in a central portion of a substrate. Then, the substrate is rotated to diffuse the liquid pool of the diluted developing solution over the entire surface of the substrate, thereby forming a liquid surface of the diluted developing solution on the substrate surface. At this time, a dissolved product is generated on the substrate by the diluted developing solution. By rotating the substrate, the dissolved product is removed from the substrate together with the diluted developing solution. Then, a liquid film is formed between the developing solution supply nozzle having a liquid contact surface and the substrate. While continuing to supply the developing solution from the developing solution supply nozzle, the substrate is rotated and the developing solution supply nozzle is moved from the central portion of the substrate to the outer peripheral portion of the substrate, thereby coating the developing solution on the entire surface of the substrate. At this time, the developing process is performed without being affected by the dissolved product because the dissolved product has already been removed by the diluted developing solution. As a result, even when the developing time is made shorter than that of the prior art, it is possible to uniformly perform the developing process within a wafer plane. Therefore, according to the present disclosure, it is possible to improve the throughput of the developing process while securing the in-plane uniformity of the developing process.

According to an embodiment of the present disclosure, there is provided a developing method for supplying a developing solution onto a substrate and developing a resist film formed on the substrate and provided with a predetermined exposed pattern, including: forming a liquid pool of a diluted developing solution diluted with pure water in a central portion of the substrate; after forming the liquid pool, forming a liquid film of the diluted developing solution on a surface of the substrate by accelerating rotation of the substrate to diffuse the liquid pool of the diluted developing solution on the entire surface of the substrate; and after forming the liquid film, supplying the developing solution onto the substrate. Supplying the developing solution includes: supplying the developing solution from a developing solution supply nozzle having a liquid contact surface while securing a gap having a predetermined size between the developing solution supply nozzle and the substrate; and moving the developing solution supply nozzle in a radial direction passing through a center of the substrate while forming a liquid pool of the developing solution between the substrate and the liquid contact surface of the developing solution supply nozzle.

According to another embodiment of the present disclosure, there is provided a non-transitory computer-readable storage medium which stores a program that operates on a computer of a control part configured to control a developing apparatus so as to cause the developing apparatus to perform the developing method.

According to still another embodiment of the present disclosure, there is provided a developing apparatus for supplying a developing solution onto a substrate and developing a resist film formed on the substrate and provided with a predetermined exposed pattern, including: a substrate holding part configured to hold a rear surface of the substrate and to rotate the held substrate about a vertical axis; a developing solution supply nozzle including a liquid contact surface and a supply hole configured to supply the developing solution to the liquid contact surface; a moving mechanism configured to move the developing solution supply nozzle; a pure water supply nozzle configured to supply pure water onto the substrate; and another moving mechanism configured to move the pure water supply nozzle.

According to still another embodiment of the present disclosure, there is provided a developing apparatus for supplying a developing solution onto a substrate and developing a resist film formed on the substrate and provided with a predetermined exposed pattern, including: a substrate holding part configured to hold a rear surface of the substrate and to rotate the held substrate about a vertical axis; a developing solution supply nozzle including a liquid contact surface and a supply hole configured to supply the developing solution to the liquid contact surface; a moving mechanism configured to move the developing solution supply nozzle; a diluted developing solution supply nozzle configured to supply a diluted developing solution onto the substrate; and another moving mechanism configured to move the diluted developing solution supply nozzle.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
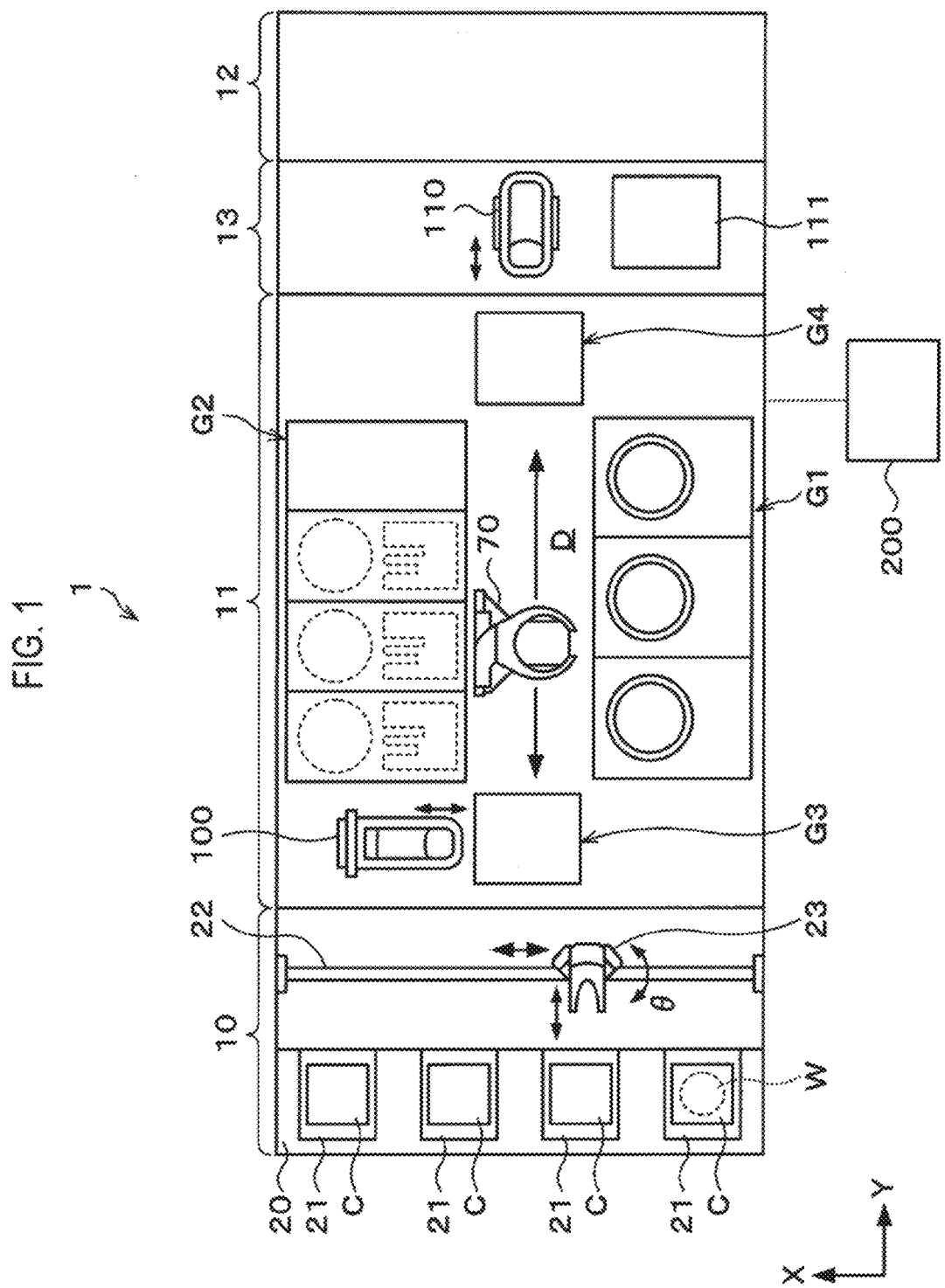
FIG. 1 is a plan view illustrating the schematic configuration of a substrate processing system according to the present embodiment.
Figure 2:
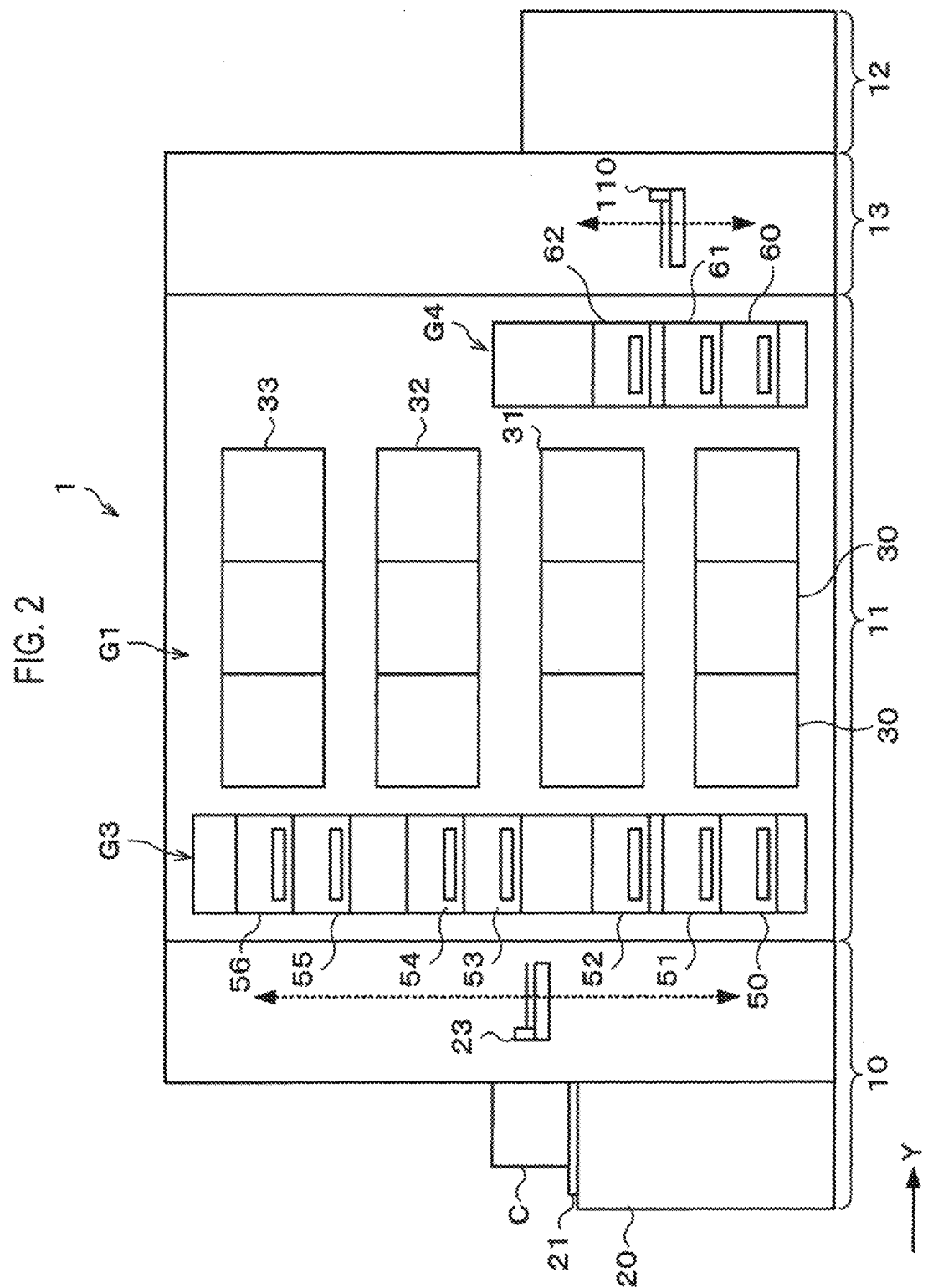
FIG. 2 is a front view illustrating the schematic configuration of the substrate processing system according to the present embodiment.
Figure 3:
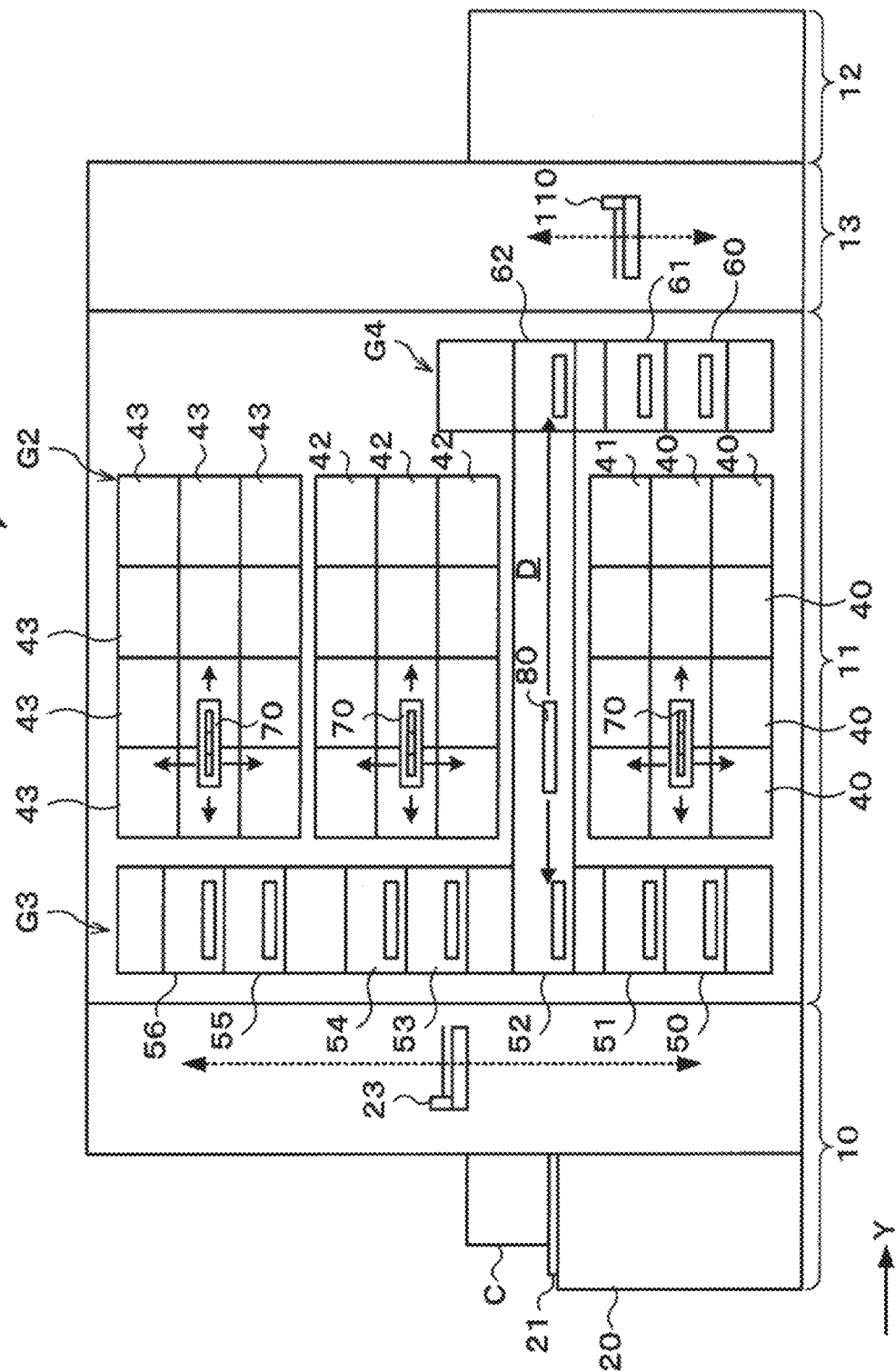
FIG. 3 is a rear view illustrating the schematic configuration of the substrate processing system according to the present embodiment.

FIG. 1 is an explanatory view illustrating the schematic configuration of a substrate processing system 1 provided with a developing apparatus which performs a developing method according to the present embodiment. FIGS. 2 and 3 are, respectively, a front view and a rear view schematically illustrating the internal configuration of the substrate processing system 1.

As illustrated in FIG. 1, the substrate processing system 1 has a configuration in which a cassette station 10 into and from which cassettes C each accommodating a plurality of wafers W are loaded and unloaded, a processing station 11 provided with various kinds of processing apparatuses for performing predetermined processes to the wafers W, and an interface station 13 configured to perform the delivery of wafers W between the processing station 11 and an exposure apparatus 12 disposed adjacent to the processing station 11, are integrally connected to one another.

A cassette mounting stand 20 is installed in the cassette station 10. A plurality of cassette mounting plates 21 configured to mount the cassettes C when the cassettes C are loaded and unloaded with respect to the exterior of the substrate processing system 1 is installed in the cassette mounting stand 20.

In the cassette station 10, there is installed a wafer transfer device 23 which is movable along a transfer path 22 extending in an X direction as illustrated in FIG. 1. The wafer transfer device 23 is also movable in an up-down direction and about a vertical axis (in a θ direction). The wafer transfer device 23 is capable of transferring the wafers W between the cassettes C mounted on the respective cassette mounting plates 21 and a delivery device of a third block G3 of the processing station 11 which will be described later.

In the processing station 11, there is provided a plurality of, e.g., four, blocks G1, G2, G3 and G4 which includes various kinds of apparatuses. For example, the first block G1 is provided at the front side (at the X-direction negative side in FIG. 1) of the processing station 11. The second block G2 is provided at the rear side (at the X-direction positive side in FIG. 1) of the processing station 11. Furthermore, the third block G3 is provided at the cassette station 10 side (at the Y-direction negative side in FIG. 1) of the processing station 11. The fourth block G4 is provided at the interface station 13 side (at the Y-direction positive side in FIG. 1) of the processing station 11.

For example, in the first block G1, as illustrated in FIG. 2, a plurality of liquid processing apparatuses, for example, a developing apparatus 30 which subjects the wafer W to a developing process, a lower antireflection film forming apparatus 31 which forms an antireflection film (hereinafter referred to as a "lower antireflection film") on a lower layer of a resist film of the wafer W, a resist coating apparatus 32 which forms a resist film by coating a resist liquid on the wafer W, and an upper antireflection film forming apparatus 33 which forms an antireflection film (hereinafter referred to as an "upper antireflection film") on an upper layer of a resist film of the wafer W, are disposed in the named order from below.

For example, three developing apparatuses 30, three lower antireflection film forming apparatuses 31, three resist coating apparatuses 32 and three upper antireflection film forming apparatuses 33 are respectively disposed side by side in the horizontal direction. The number and arrangement of the developing apparatuses 30, the lower antireflection film forming apparatuses 31, the resist coating apparatuses 32 and the upper antireflection film forming apparatuses 33 may be arbitrarily selected.

In the lower antireflection film forming apparatus 31, the resist coating apparatus 32 and the upper antireflection film forming apparatus 33, for example, spin coating which coats a predetermined coating liquid on the wafer W is performed. In the spin coating, for example, a coating liquid is ejected from a coating nozzle onto the wafer W and is diffused on the surface of the wafer W by rotating the wafer W. Descriptions will be made later on the configuration of the developing apparatus 30.

For example, in the second block G2, as illustrated in FIG. 3, there is provided a plurality of heat treatment apparatuses 40 to 43 which performs heat treatments such as heating and cooling of the wafer W.

For example, in the third block G3, a plurality of delivery devices 50, 51, 52, 53, 54, 55 and 56 is sequentially provided from below. Furthermore, in the fourth block G4, a plurality of delivery devices 60, 61 and 62 is sequentially provided from below.

As illustrated in FIG. 1, a wafer transfer region D is formed in the area surrounded by the first block G1, the second block G2, the third block G3 and the fourth block G4. In the wafer transfer region D, there is disposed, for example, a plurality of wafer transfer devices 70 which includes a transfer arm capable of moving in the Y direction, the X direction, the θ direction and the up-down direction. The wafer transfer devices 70 are moved within the wafer transfer region D and are capable of transferring the wafers W to predetermined apparatuses disposed in the first block G1, the second block G2, the third block G3 and the fourth block G4 existing around the wafer transfer region D.

Furthermore, in the wafer transfer region D, a shuttle transfer device 80 which linearly transfers the wafer W between the third block G3 and the fourth block G4.

The shuttle transfer device 80 is linearly movable, for example, in the Y direction in FIG. 3. The shuttle transfer device 80 is moved in the Y direction while supporting the wafer W and is capable of transferring the wafer W between the delivery device 52 of the third block G3 and the delivery device 62 of the fourth block G4.

As illustrated in FIG. 1, a wafer transfer device 100 is provided at the X-direction positive side of the third block G3. The wafer transfer device 100 includes a transfer arm which is movable, for example, in the X direction, the θ direction and the up-down direction. The wafer transfer device 100 is moved up and down while supporting the wafer W and is capable of transferring the wafer W to the respective delivery devices disposed in the third block G3.

In the interface station 13, there are provided a wafer transfer device 110 and a delivery device 111. The wafer transfer device 110 includes a transfer arm which is movable, for example, in the Y direction, the θ direction and the up-down direction. The wafer transfer device 110 is configured to support the wafer W, for example, by the transfer arm and is capable of transferring the wafer W between the respective delivery devices of the fourth block G4, the delivery device 111 and the exposure apparatus 12.

Figure 4:
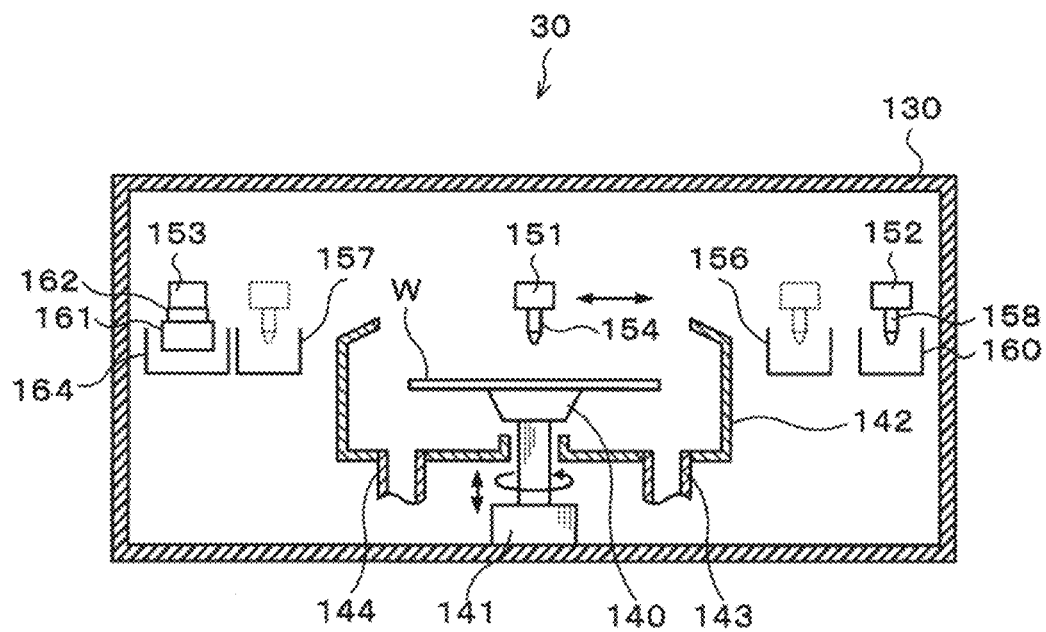
FIG. 4 is a vertical sectional view illustrating the schematic configuration of a developing apparatus.

Next, descriptions will be made on the configuration of the aforementioned developing apparatus 30. As illustrated in FIG. 4, the developing apparatus 30 includes a processing container 130, the interior of which is sealable. A loading/unloading gate (not illustrated) for the wafer W is formed on the side surface of the processing container 130.

A spin chuck 140 as a substrate holding portion for holding and rotating the wafer W is installed within the processing container 130. The spin chuck 140 may be rotated at a predetermined speed by a chuck drive part 141 such as, e.g., a motor or the like. An up-down drive mechanism such as, e.g., a cylinder or the like, is installed in the chuck drive part 141. Thus, the spin chuck 140 is movable up and down.

A cup 142 which receives and recovers the liquid scattering or dropping from the wafer W is installed around the spin chuck 140. A discharge pipe 143 which discharges the recovered liquid and an exhaust pipe 144 which exhausts the internal atmosphere of the cup 142 are connected to the lower surface of the cup 142.

Figure 5:
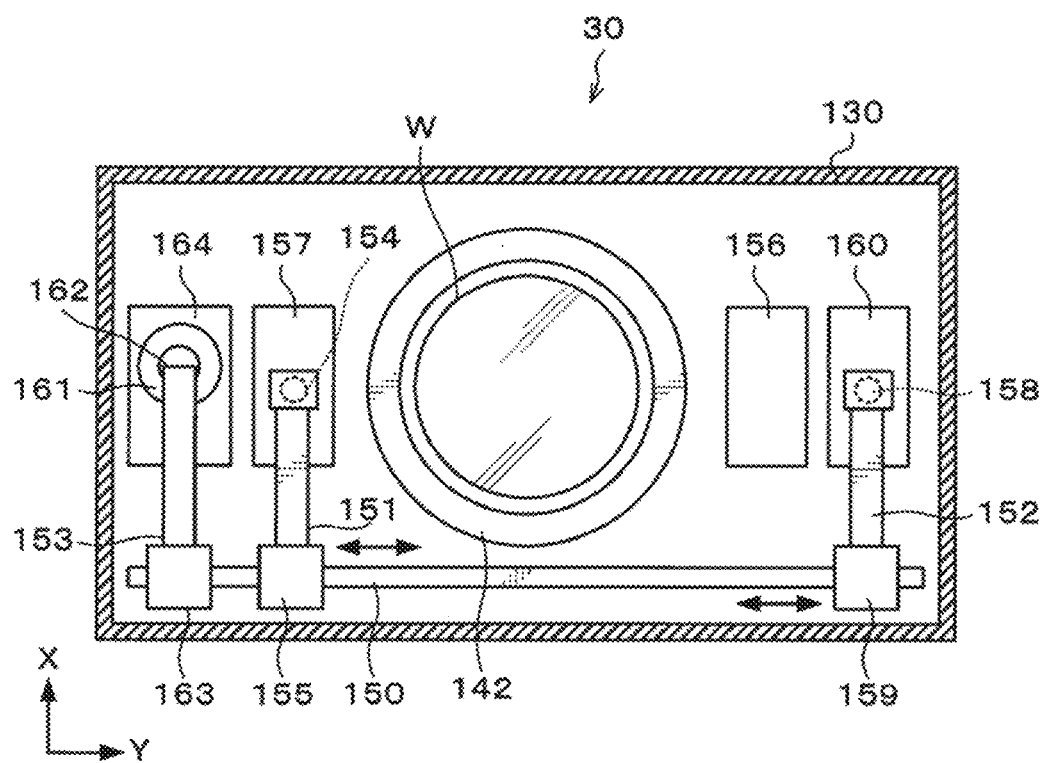
FIG. 5 is a horizontal sectional view illustrating the schematic configuration of the developing apparatus.

As illustrated in FIG. 5, a rail 150 extending along the Y direction (the left-right direction in FIG. 5) is formed at the X-direction negative side (the lower side in FIG. 5) of the cup 142. The rail 150 is formed to extend, for example, from the outside of the cup 142 at the Y-direction negative side (the left side in FIG. 5) to the outside of the cup 142 at the Y-direction positive side (the right side in FIG. 5). For example, three arms 151, 152 and 153 are installed in the rail 150.

A pure water supply nozzle 154 which supplies pure water is supported on the first arm 151. The first arm 151 is movable along the rail 150 by a nozzle drive part 155 illustrated in FIG. 5. Thus, the pure water supply nozzle 154 may move from a standby part 156 installed outside the cup 142 at the Y-direction positive side to a standby part 157 installed outside the cup 142 at the Y-direction negative side through the upper side of the central portion of the wafer W disposed within the cup 142.

A dilution-purpose developing solution supply nozzle 158 which supplies a dilution-purpose developing solution in a first liquid pool forming step to be described later is supported on the second arm 152. The second arm 152 is movable along the rail 150 by a nozzle drive part 159 illustrated in FIG. 5. Thus, the dilution-purpose developing solution supply nozzle 158 may move from a standby part 160 installed outside the cup 142 at the Y-direction positive side to the upper side of the central portion of the wafer W disposed within the cup 142. The standby part 160 is installed at the Y-direction positive side of the standby part 156. As the dilution-purpose developing solution, it may be possible to use, for example, tetra-methyl ammonium hydroxide (TMAH) having a concentration of 2.38%.

Figure 6:
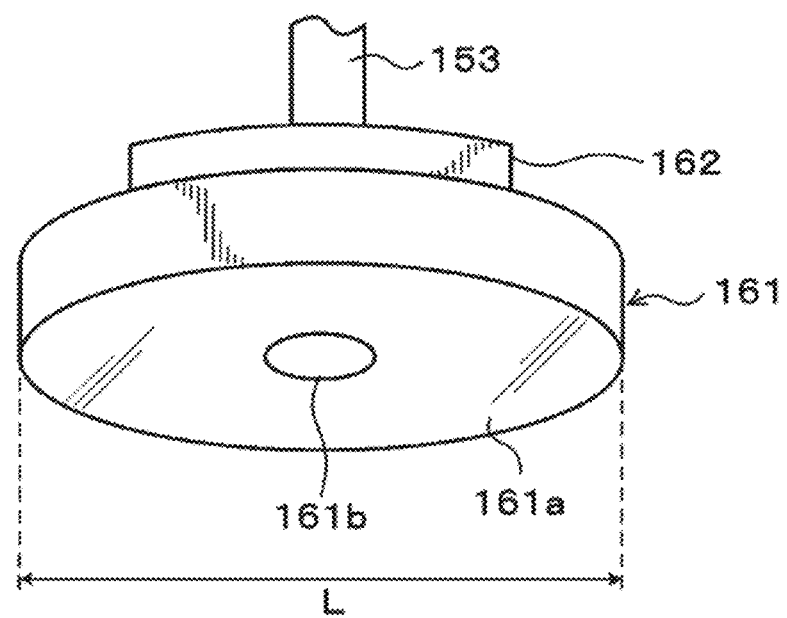
FIG. 6 is a perspective view illustrating the schematic configuration of a developing solution supply nozzle.

A developing solution supply nozzle 161 which supplies a developing solution is supported on the third arm 153 through a rotary drive mechanism 162. For example, as illustrated in FIG. 6, the developing solution supply nozzle 161 has a cylindrical shape as a whole and includes a lower end surface 161a, for example, parallel to the wafer W. The lower end surface 161a serves as a liquid contact surface which makes contact with a developing solution. The lower end surface 161a need not be necessarily parallel to the wafer W but may have any shape capable of forming a liquid film of a developing solution between the lower end surface 161a of the developing solution supply nozzle 161 and the wafer W in a developing solution liquid pool forming step to be described later. For example, the lower end surface 161a may have a downwardly-bulging gentle spherical surface shape or a slant surface shape. Furthermore, a supply hole 161b which supplies a developing solution is formed in, for example, the central portion of the lower end surface 161a of the developing solution supply nozzle 161. The diameter L of the developing solution supply nozzle 161 is set smaller than the diameter of the wafer W. Similar to the developing solution supplied from the dilution-purpose developing solution supply nozzle 158, the developing solution supplied from the developing solution supply nozzle 161 may be tetra-methyl ammonium hydroxide (TMAH) having a concentration of 2.38%. In the present embodiment, the diameter of the wafer W may be, for example, 300 mm and the diameter L of the developing solution supply nozzle 161 may be, for example, 50 mm. In addition, the developing solution supply nozzle 161 may be made of a material such as, for example, polytetrafluoroethylene (PTFE) or the like, which has a chemical resistance.

The rotary drive mechanism 162 supports the upper surface of the developing solution supply nozzle 161 and may rotate the developing solution supply nozzle 161 about a vertical axis.

The third arm 153 is movable along the rail 150 by a nozzle drive part 163 as a moving mechanism illustrated in FIG. 5. Thus, the developing solution supply nozzle 161 may move from a standby part 164 installed outside the cup 142 at the Y-direction negative side to the upper side of the central portion of the wafer W disposed within the cup 142. The standby part 164 is installed at the Y-direction negative side of the standby part 157. The third arm 153 is movable up and down by the nozzle drive part 163 and is capable of adjusting the height of the developing solution supply nozzle 161.

The configurations of other liquid processing apparatuses, namely the lower antireflection film forming apparatus 31, the resist coating apparatus 32 and the upper antireflection film forming apparatus 33, are identical with the configuration of the above-described developing apparatus 30 except the difference in the shape and number of the nozzles and the liquids supplied from the nozzles. Therefore, descriptions on the configurations of other liquid processing apparatuses will be omitted.

As illustrated in FIG. 1, a control part 200 is installed in the substrate processing system 1 described above. The control part 200 is, for example, a computer and includes a program storage part (not illustrated). A program which controls the processing of the wafer W performed in the substrate processing system 1 is stored in the program storage part. Furthermore, a program for controlling the operations of the various kinds of processing apparatuses and the drive systems such as the transfer devices or the like and for implementing a below-described delamination process in the substrate processing system 1 is also stored in the program storage part. The aforementioned programs are recorded in a computer-readable non-transitory storage medium such as, for example, a computer-readable hard disk (HD), a flexible disk (FD), a compact disk (CD), a magneto-optical disk (MO), a memory card or the like and may be installed in the control part 200 from the storage medium.

Figure 7:
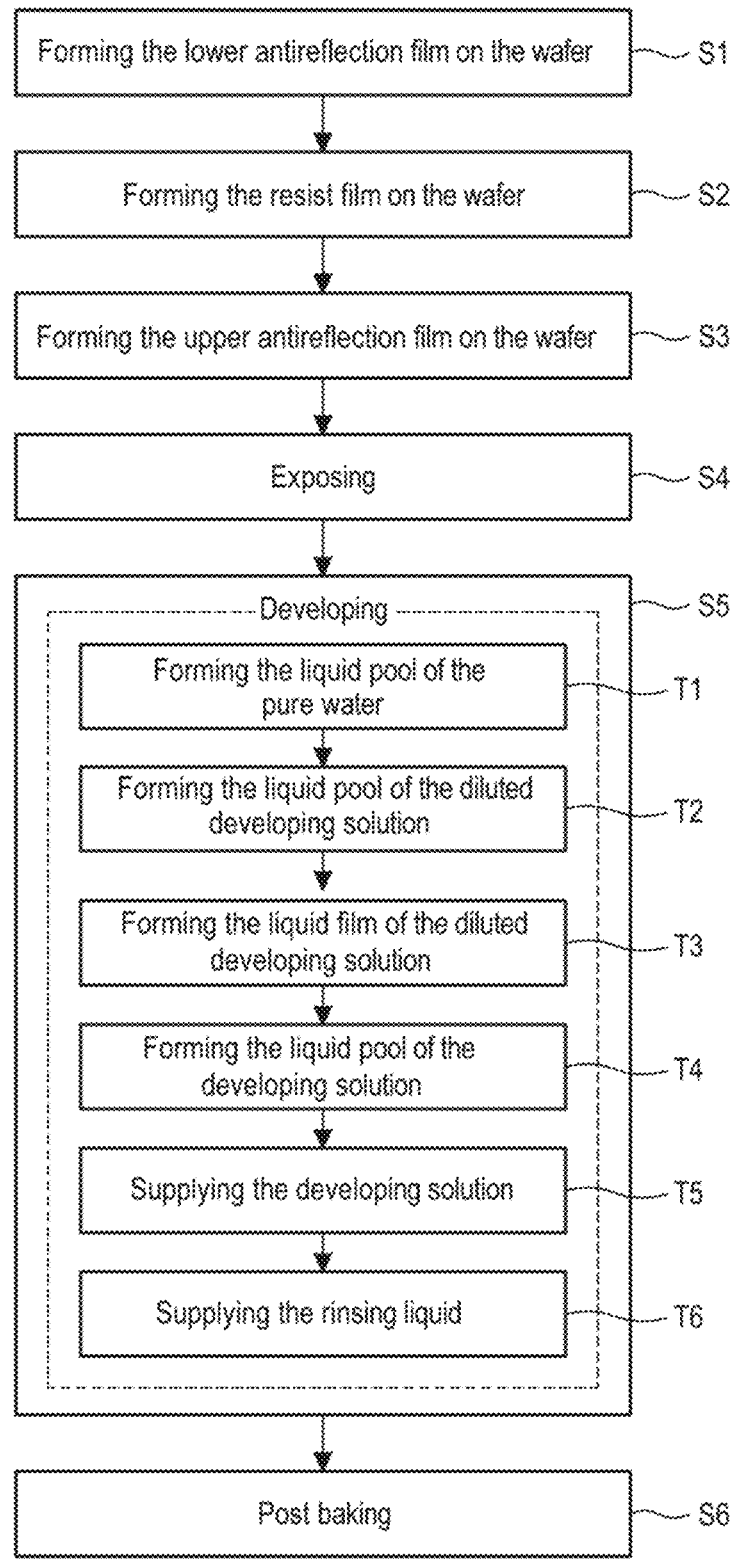
FIG. 7 is a flowchart explaining major steps of a wafer processing process.
Figure 8:
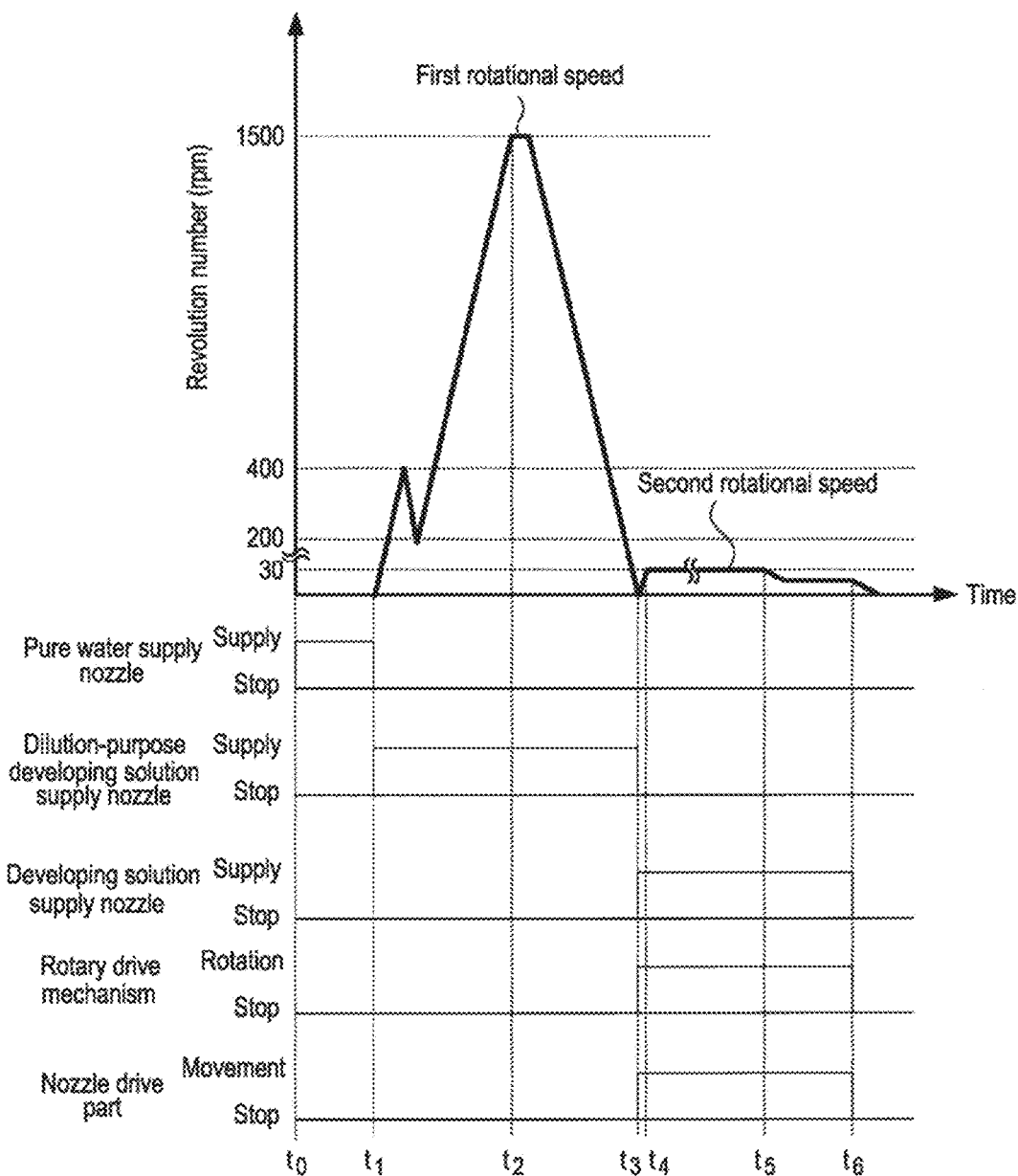
FIG. 8 is a time chart illustrating the rotation speed of a wafer and the operations of respective parts in a developing process.

Next, descriptions will be made on a wafer processing process performed using the substrate processing system 1 configured as above. FIG. 7 is a flowchart illustrating major steps of a wafer processing process. Furthermore, FIG. 8 is a time chart illustrating the rotation speed of the wafer W and the operations of the respective parts in the developing process performed by the developing apparatus 30.

First, a cassette C which accommodates a plurality of wafers W therein is loaded into the cassette station 10 of the substrate processing system 1. The respective wafers W accommodated in the cassette C are sequentially transferred to the delivery device 53 of the processing station 11 by the wafer transfer device 23.

Then, the wafer W is transferred to the heat treatment apparatus 40 of the second block G2 by the wafer transfer device 70 and is subjected to temperature adjustment. Thereafter, the wafer W is transferred to, for example, the lower antireflection film forming apparatus 31 of the first block G1 by the wafer transfer device 70. A lower antireflection film is formed on the wafer W (Step S1 in FIG. 7). Thereafter, the wafer W is transferred to the heat treatment apparatus 41 of the second block G2 and is subjected to a heat treatment.

Subsequently, the wafer W is transferred to the heat treatment apparatus 42 of the second block G2 by the wafer transfer device 70 and is subjected to temperature adjustment. Thereafter, the wafer W is transferred to the resist coating apparatus 32 of the first block G1 by the wafer transfer device 70. A resist film is formed on the wafer W (Step S2 in FIG. 7). Thereafter, the wafer W is transferred to the heat treatment apparatus 43 and is subjected to pre-baking.

Next, the wafer W is transferred to the upper antireflection film forming apparatus 33 of the first block G1. An upper antireflection film is formed on the wafer W (Step S3 in FIG. 7). Thereafter, the wafer W is transferred to the heat treatment apparatus 43 of the second block G2 and is subjected to a heat treatment. Thereafter, the wafer W is transferred to the delivery device 56 of the third block G3 by the wafer transfer device 70.

Then, the wafer W is transferred to the delivery device 52 by the wafer transfer device 100 and is transferred to the delivery device 62 of the fourth block G4 by the shuttle transfer device 80. Thereafter, the wafer W is transferred to the exposure apparatus 12 by the wafer transfer device 110 of the interface station 13 and is exposed in a predetermined pattern (Step S4 in FIG. 7).

Subsequently, the wafer W is transferred to the heat treatment apparatus 40 by the wafer transfer device 70 and is subjected to post-exposure baking. Thus, the wafer W is subjected to a deprotection reaction by the acid generated in the exposed portion of the resist film. Thereafter, the wafer W is transferred to the developing apparatus 30 by the wafer transfer device 70 and is subjected to a developing process (Step S5 in FIG. 7).

Figure 9:
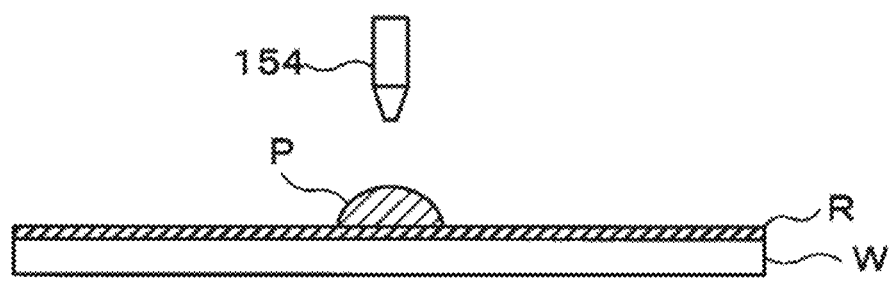
FIG. 9 is a vertical sectional explanatory view illustrating a state in which a liquid pool of pure water is formed on a wafer.

In the developing process, as illustrated in FIG. 9, a predetermined amount of pure water P is first supplied to the central portion of the wafer W, on which the resist film R is formed, by the pure water supply nozzle 154 (time $t_0$ to $t_1$ in FIG. 8). At this time, the pure water P is supplied in a state in which the wafer W is not rotating. Thus, a liquid pool of the pure water P is formed in the central portion of the wafer W (Step T1 in FIG. 7). Furthermore, at Step T1, the wafer W need not be necessarily in the state of not-rotating. The pure water P may be supplied while rotating the wafer W, as long as the wafer W is rotated at such a low speed that the liquid pool of the pure water P is formed in the central portion of the wafer W.

Figure 10:
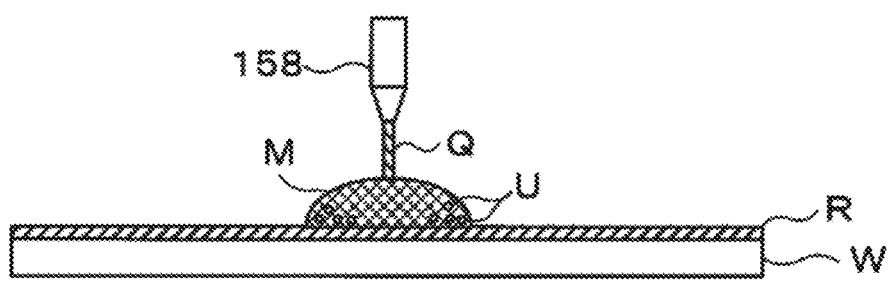
FIG. 10 is a vertical sectional explanatory view illustrating a state in which a dilution-purpose developing solution is supplied onto the liquid pool of pure water.

Next, the supply of the pure water P is stopped. As illustrated in FIG. 10, the dilution-purpose developing solution supply nozzle 158 is moved to the upper side of the central portion of the wafer W. A predetermined amount of dilution-purpose developing solution Q is supplied on the liquid pool of the pure water P (time $t_1$ in FIG. 8). Thus, the dilution-purpose developing solution Q is diluted by the pure water P existing on the wafer W. A liquid pool of a diluted developing solution M is formed on the wafer W (liquid pool forming step, Step T2 in FIG. 7). At this time, the resist film R and the diluted developing solution M make contact with each other. Thus, the resist film R is slightly developed and a dissolved product U is generated. The dissolved product U stays at the outer periphery side of the liquid pool along with the flow of the diluted developing solution M. In addition, the ratio of the supply amount of the pure water P and the supply amount of the dilution-purpose developing solution Q, namely the concentration of the diluted developing solution M, is set such that, for example, the concentration of tetra-methyl ammonium hydroxide (TMAH) becomes lower than about 2.38%.

Figure 11:
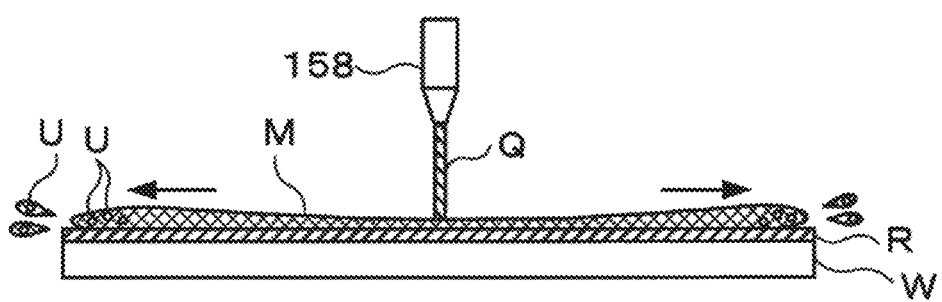
FIG. 11 is a vertical sectional explanatory view illustrating a state in which the diluted developing solution is diffused toward the outer periphery of a wafer W by rotating the wafer.

Next, the wafer W is accelerated to a first rotational speed by the spin chuck 140 while continuing to supply the developing solution from the dilution-purpose developing solution supply nozzle 158 (time $t_1$ to $t_2$ in FIG. 8). Thus, as illustrated in FIG. 11, the diluted developing solution M is diffused from the center of the wafer W toward the outer periphery thereof. As a result, a liquid film of the diluted developing solution M is formed on the entire surface of the wafer W (liquid film forming step, Step T3 in FIG. 7). The first rotational speed may be a speed at which the diluted developing solution M is diffused toward the outer periphery of the wafer W and is discharged to the outside of the wafer W. For example, the first rotational speed in some embodiments may be from 1,500 rpm to 2,000 rpm. In the present embodiment, the first rotational speed is 1,500 rpm. Furthermore, the acceleration at the time of accelerating the wafer W is, for example, 3,000 rpm/second.

If the liquid film of the diluted developing solution M is formed on the wafer W, the resist film R is slightly developed on the entire surface of the wafer W. Thus, a dissolved product U is generated. By diffusing the diluted developing solution M at the first rotational speed which is a relatively high speed, the dissolved product U is discharged from the outer peripheral portion of the wafer W together with the diluted developing solution M. In FIG. 8, during the course of accelerating the wafer W to the first rotational speed, for example, the rotational speed is reduced to 200 rpm after the rotational speed reaches 400 rpm. By performing the speed reduction in this way, an inertial force generated in the circumferential direction of the wafer W as well as a centrifugal force acts on the diluted developing solution M existing on the wafer W. This makes it possible to more uniformly diffuse the diluted developing solution M. When accelerating the wafer W to the first rotational speed, it is not necessarily required to perform the speed reduction illustrated in FIG. 8.

After the rotational speed of the wafer W reaches the first rotational speed, the rotation at the first rotational speed is maintained for, e.g., 0.5 second. Thereafter, the rotational speed of the wafer W is decelerated to stop the wafer W. In this case, the deceleration at the time of decelerating the wafer W is also 3,000 rpm/second (time $t_2$ to $t_3$ in FIG. 8). During the time period between time $t_2$ and time $t_3$, the developing solution is continuously supplied from the dilution-purpose developing solution supply nozzle 158.

Figure 12:
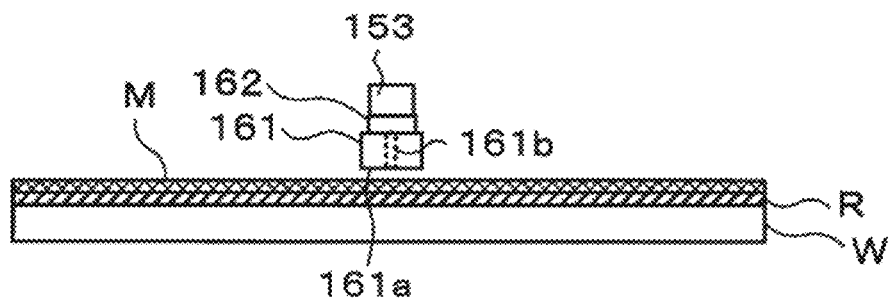
FIG. 12 is a vertical sectional explanatory view illustrating a state in which a developing solution supply nozzle is moved to above the central portion of the wafer.

Next, the wafer W is stopped and the supply of the developing solution Q from the dilution-purpose developing solution supply nozzle 158 is stopped. The dilution-purpose developing solution supply nozzle 158 is retracted from above the wafer W. As illustrated in FIG. 12, the developing solution supply nozzle 161 is moved to the upper side of the central portion of the wafer W. At this time, a gap having a predetermined size is formed between the lower end surface 161a of the developing solution supply nozzle 161 and the upper surface of the wafer W. The size of the gap is approximately from 0.5 mm to 2 mm.

Figure 13:
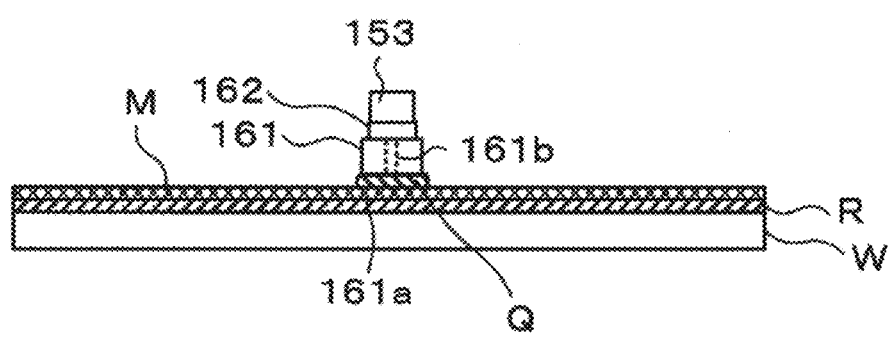
FIG. 13 is a vertical sectional explanatory view illustrating a state in which a liquid film of a developing solution is formed between the lower end surface of the developing solution supply nozzle and the wafer.
Figure 14:
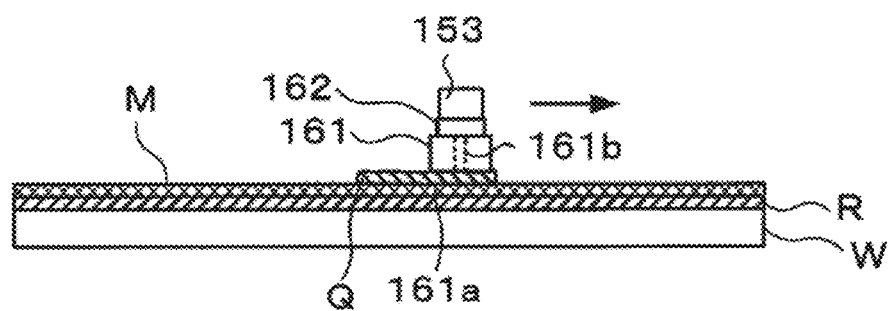
FIG. 14 is a vertical sectional explanatory view illustrating a state in which the developing solution supply nozzle is moved toward the outer periphery of the wafer while supplying the developing solution.

Subsequently, the developing solution Q is supplied from the developing solution supply nozzle 161, thereby forming a liquid pool of the developing solution Q between the lower end surface 161a of the developing solution supply nozzle 161 and the wafer W as illustrated in FIG. 13 (developing solution liquid pool forming step, Step T4 in FIG. 7). At the same time, the developing solution supply nozzle 161 starts to be moved from the central portion of the wafer W toward the outer peripheral portion thereof as illustrated in FIG. 14 while rotating the developing solution supply nozzle 161 by the rotary drive mechanism 162. In this case, the developing solution supply nozzle 161 is moved through the center of the wafer W. At this time, the rotational speed of the developing solution supply nozzle 161 in some embodiments may be from 50 rpm to 200 rpm. In the present embodiment, the rotational speed of the developing solution supply nozzle 161 is 130 rpm. The moving velocity of the developing solution supply nozzle 161 toward the outer peripheral portion of the wafer W in some embodiments may be from 10 mm/s to 100 mm/s. In the present embodiment, the moving velocity of the developing solution supply nozzle 161 is 15 mm/s. Furthermore, the rotation direction of the developing solution supply nozzle 161 is set to become opposite to the rotation direction of the wafer W. This makes it possible to stir the developing solution Q on the wafer W and to perform the developing process with increased in-plane uniformity.

Figure 15:
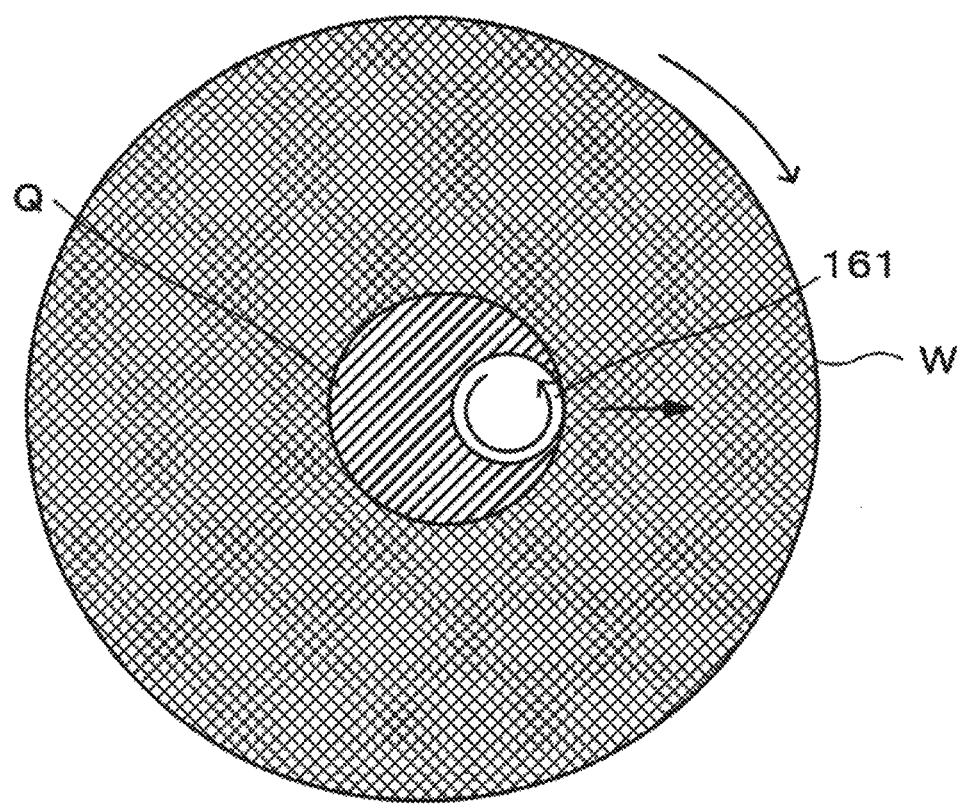
FIG. 15 is an explanatory plan view illustrating a state in which the developing solution supply nozzle is moved toward the outer periphery of the wafer while supplying the developing solution.

Simultaneously with the start of supply of the developing solution Q from the developing solution supply nozzle 161, the wafer W is accelerated to a second rotational speed lower than the first rotational speed (time $t_3$ to $t_4$ in FIG. 8). For example, the second rotational speed in some embodiments may be from 15 rpm to 30 rpm. In the present embodiment, the second rotational speed is 30 rpm. Furthermore, the acceleration at the time of accelerating the wafer W is, for example, 3,000 rpm/second. Thus, as illustrated in FIG. 15, the developing solution Q is gradually supplied from the central portion of the wafer W toward the outer periphery thereof.

If the developing solution supply nozzle 161 comes close to the outer peripheral portion of the wafer W, the rotational speed of the wafer W is decelerated to a speed lower than the second rotational speed, for example, 15 rpm (time $t_5$ in FIG. 8). At this time, the deceleration is, for example, 100 rpm/second. In this way, by reducing the rotational speed of the wafer W after the developing solution supply nozzle 161 reaches the vicinity of the outer peripheral portion of the wafer W, it is possible to prevent the developing solution Q from falling down to the outside of the wafer W due to a centrifugal force. Then, the developing solution supply nozzle 161 is moved to the outer peripheral end portion of the wafer W while maintaining the rotational speed of the wafer W at 15 rpm, thereby supplying the developing solution to the entire surface of the wafer W (developing solution supply step, Step T5 in FIG. 7). At this time, the liquid film of the diluted developing solution is formed on the wafer W at Step T3, whereby the dissolved product U is discharged from above the wafer W. Therefore, even if the developing solution Q is supplied onto the wafer W, the generation amount of the dissolved product U is suppressed to a very small amount. As a result, the resist film R existing on the wafer W is developed without being affected by the dissolved product U.

Thereafter, if the developing solution supply nozzle 161 reaches the outer peripheral end portion of the wafer W, the supply of the developing solution Q from the developing solution supply nozzle 161 and the rotation of the developing solution supply nozzle 161 are stopped (time $t_6$ in FIG. 8). The developing solution supply nozzle 161 is retracted from above the wafer W. Even after the supply of the developing solution Q is stopped, the rotation of the wafer W may be maintained for a while in order to make uniform the developing solution Q existing on the wafer W.

Subsequently, if the developing process is completed, the rotational speed of the wafer W is reduced to stop the wafer W. Then, the pure water is supplied from, for example, the pure water supply nozzle 154 onto the wafer W. Thus, the rinsing process of the wafer W is performed (Step T6 in FIG. 7). Consequently, the developing solution Q and the dissolved resist are washed away and the developing process is completed.

After the completion of the developing process, the wafer W is transferred to the heat treatment apparatus 42 by the wafer transfer device 70 and is subjected to post baking (Step S6 in FIG. 7). Then, the temperature of the wafer W is adjusted by the heat treatment apparatus 43. Thereafter, the wafer W is transferred to the cassette C of a predetermined cassette mounting plate 21 by virtue of the wafer transfer device 70 and the wafer transfer device 23, whereby a series of photolithography steps are completed.

Figure 16:
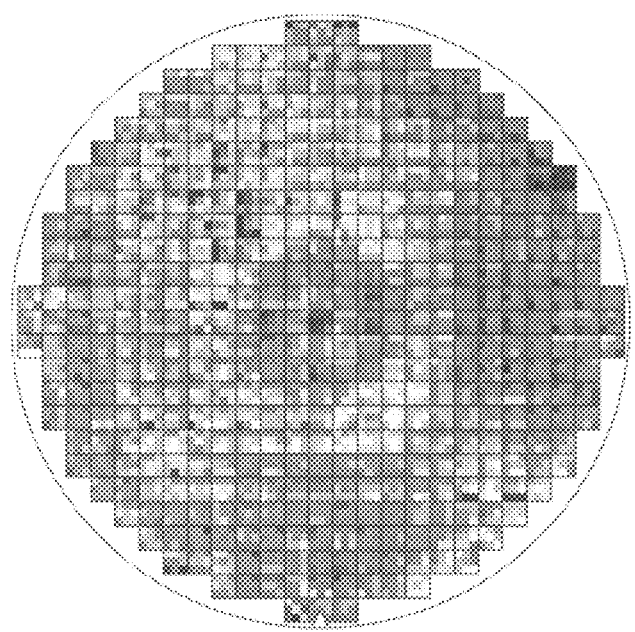
FIG. 16 is an explanatory view illustrating a variation in a line width of a resist pattern when a developing process is performed by a developing method according to the present embodiment.
Figure 27:
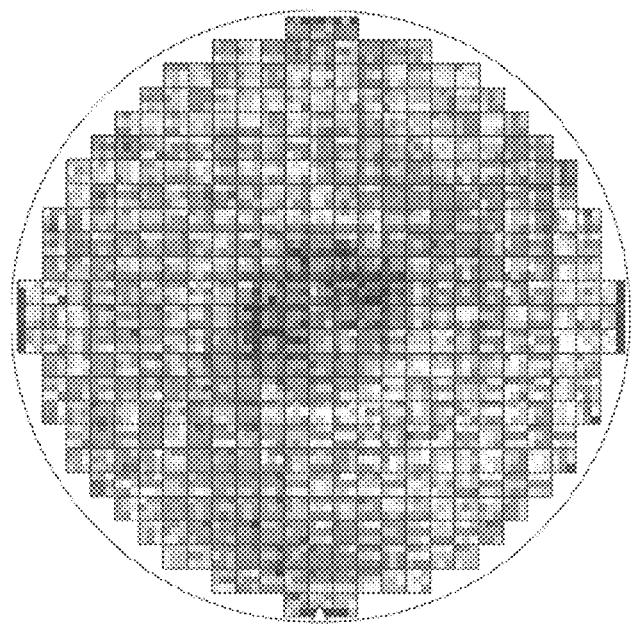
FIG. 27 is an explanatory view illustrating a variation in a line width of a resist pattern.

According to the embodiment described above, the liquid pool of the diluted developing solution M is first formed in the central portion of the wafer W. Then, the wafer W is accelerated to the first rotational speed, thereby diffusing the liquid pool on the entire surface of the wafer W and forming the liquid film of the diluted developing solution M on the surface of the wafer W (Step T3). At this time, the dissolved product U is formed on the wafer W by the diluted developing solution M. By accelerating the wafer W to the first rotational speed, the diluted developing solution M and the dissolved product U are discharged from above the wafer W. Then, the liquid film of the developing solution Q is formed between the wafer W and the developing solution supply nozzle 161 which includes the lower end surface 161a (the liquid contact surface), for example, parallel to the wafer W. The wafer W is rotated while continuing to supply the developing solution from the developing solution supply nozzle 161. The developing solution supply nozzle 161 is moved from the central portion of the wafer W to the outer peripheral portion thereof, thereby coating the developing solution Q on the entire surface of the wafer W. At this time, the resist film R is developed without being affected by the dissolved product U because the dissolved product U has already been removed by the diluted developing solution M at Step T3. As a result, as illustrated in FIG. 16, even when the developing time is made shorter than that of the prior art, it is possible to perform the developing process with increased in-plane uniformity. FIG. 16 is a view in which the degree of a variation in the line width of the resist pattern within the plane of the wafer W when the developing process is performed for 30 seconds using the developing method according to the present embodiment is illustrated by color shading on a shot-by-shot basis. It can be confirmed that in FIG. 16, the variation in the line width is suppressed substantially at the same level as that of FIG. 27 in which the developing time is set at 60 seconds as described earlier. Therefore, according to the present disclosure, it is possible to improve the throughput of the developing process while securing the in-plane uniformity of the developing process.

Since the developing solution supply nozzle 161 is moved toward the outer peripheral portion of the wafer W while rotating the developing solution supply nozzle 161 in the direction opposite to the rotation direction of the wafer W, it is possible to stir the developing solution Q on the wafer W and to perform the developing process with increased in-plane uniformity. It is not necessarily required to perform the rotation of the developing solution supply nozzle 161. According to the study conducted by the present inventors, it was confirmed that even when the rotation of the developing solution supply nozzle 161 is not performed, it is possible to realize the desired developing accuracy.

A resist for immersion exposure employed in recent years has a large contact angle with a developing solution. Thus, it is not easy to uniformly coat a developing solution on a resist film. However, if the wafer W is pre-wetted by initially diffusing the liquid pool of the diluted developing solution M on the entire surface of the wafer W through the high-speed rotation of the wafer W as in the present embodiment, it is possible to expect an effect of reducing the contact angle between the resist film R and the developing solution Q (an effect of improving the wettability of the developing solution with respect to the resist film). As a result, it is possible to supply the developing solution to the wafer W with increased in-plane uniformity. This makes it possible to further improve the uniformity of the developing process in the wafer plane. Since the contact angle between the resist film R and the developing solution Q becomes small, it is possible to reduce the supply amount of the developing solution Q. According to the study conducted by the present inventors, it was confirmed that while about 80 cc of the developing solution Q is needed in the prior art in order to develop the wafer W of, e.g., 300 mm in size, the use of the developing method of the present embodiment makes it possible to reduce the supply amount of the developing solution Q to about 43 cc.

Since the diluted developing solution M diluted with the pure water is used when pre-wetting the wafer W, there is no possibility that development occurs only in the dropping position of the diluted developing solution M, namely in the central portion of the wafer W in the present embodiment. Accordingly, in this respect, it is possible to develop the wafer W with increased in-plane uniformity.

Figure 17:
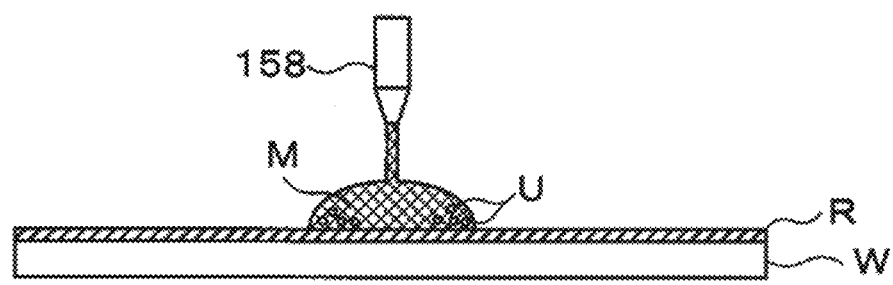
FIG. 17 is a vertical sectional explanatory view illustrating a state in which the diluted developing solution is directly supplied onto a resist film.

In the embodiment described above, when forming the liquid pool of the diluted developing solution M at Step T2, the dilution-purpose developing solution Q is supplied onto the liquid pool of the pure water P. However, the method of forming the liquid pool of the diluted developing solution M is not limited to the content of the present embodiment. For example, the diluted developing solution M diluted with the pure water in advance may be supplied to the dilution-purpose developing solution supply nozzle 158. For example, as illustrated in FIG. 17, the liquid pool of the diluted developing solution M may be formed by directly supplying the diluted developing solution M in the form of the resist film R. By doing so, it is possible to omit Step T1 at which the liquid pool of the pure water P is formed. This makes it possible to further improve the throughput of the developing process. In this case, the dilution-purpose developing solution supply nozzle 158 serves as a diluted developing solution supply nozzle.

Figure 18:
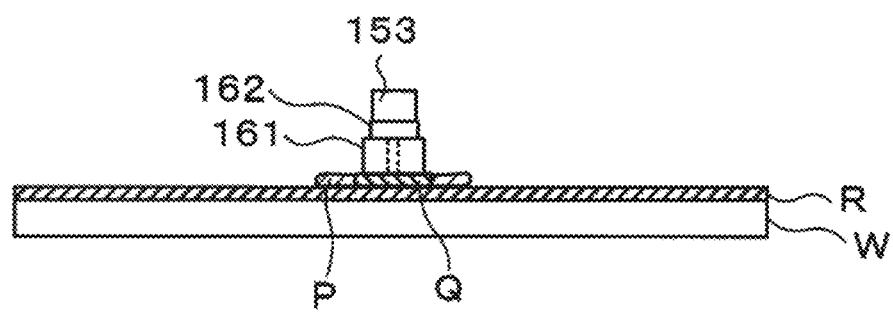
FIG. 18 is a vertical sectional explanatory view illustrating a state in which the dilution-purpose developing solution is supplied by the developing solution supply nozzle.

In the embodiment described above, when forming the liquid film of the diluted developing solution M at Step T3, the developing solution Q is supplied from the dilution-purpose developing solution supply nozzle 158. However, the supply of the developing solution Q at the time of forming the liquid film of the diluted developing solution M may be performed by the developing solution supply nozzle 161. In this case, for example, as illustrated in FIG. 18, the developing solution supply nozzle 161 is brought into contact with the liquid pool of the pure water P. In this state, the dilution-purpose developing solution Q is supplied. Thus, the developing solution Q is diluted by the pure water P. The liquid film of the diluted developing solution M is formed on the wafer W by rotating the wafer W at the first rotational speed at Step T3.

Figure 19:
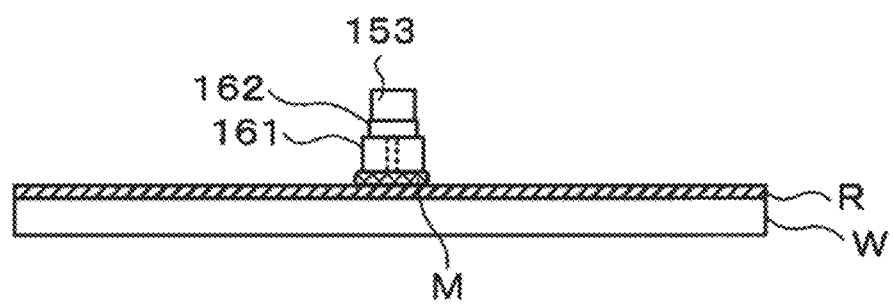
FIG. 19 is a vertical sectional explanatory view illustrating a state in which a liquid pool of the diluted developing solution is formed by the developing solution supply nozzle.

When forming the liquid film of the diluted developing solution M with the developing solution supply nozzle 161, the diluted developing solution M may be supplied from the developing solution supply nozzle 161. As illustrated in FIG. 19, the liquid pool of the diluted developing solution M may be directly formed between the wafer W and the developing solution supply nozzle 161. Even in this case, the liquid film of the diluted developing solution M is formed on the wafer W by rotating the wafer W at the first rotational speed at Step T3.

Figure 20:
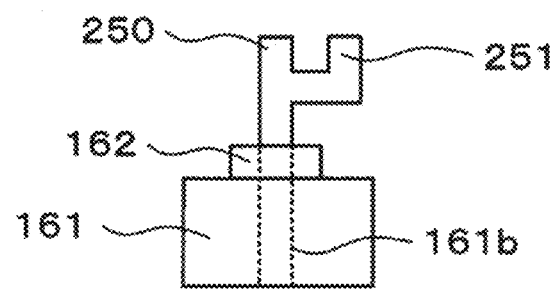
FIG. 20 is an explanatory view illustrating the schematic configuration of a developing solution supply nozzle according to another embodiment.
Figure 21:
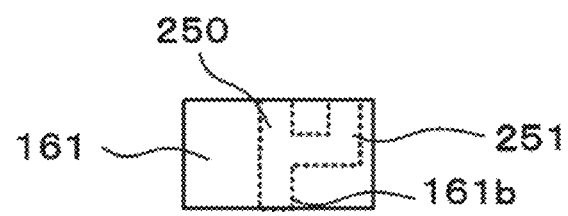
FIG. 21 is an explanatory view illustrating the schematic configuration of a developing solution supply nozzle according to still another embodiment.

In the case where both the developing solution Q and the diluted developing solution M are supplied from the developing solution supply nozzle 161, a developing solution pipe 250 for supplying the developing solution Q and a diluted developing solution pipe 251 for supplying the diluted developing solution M are connected to the developing solution supply nozzle 161 as illustrated in FIG. 20. Furthermore, in the case where the rotary drive mechanism 162 is not installed in the developing solution supply nozzle 161, the developing solution pipe 250 and the diluted developing solution pipe 251 may be merged within the developing solution supply nozzle 161 as illustrated in FIG. 21. In this case, the developing solution supply nozzle 161 illustrated in FIGS. 20 and 21 serves also as a diluted developing solution supply nozzle. In other words, the supply hole 161b is shared by the developing solution supply nozzle 161 and the diluted developing solution supply nozzle.

Figure 22:
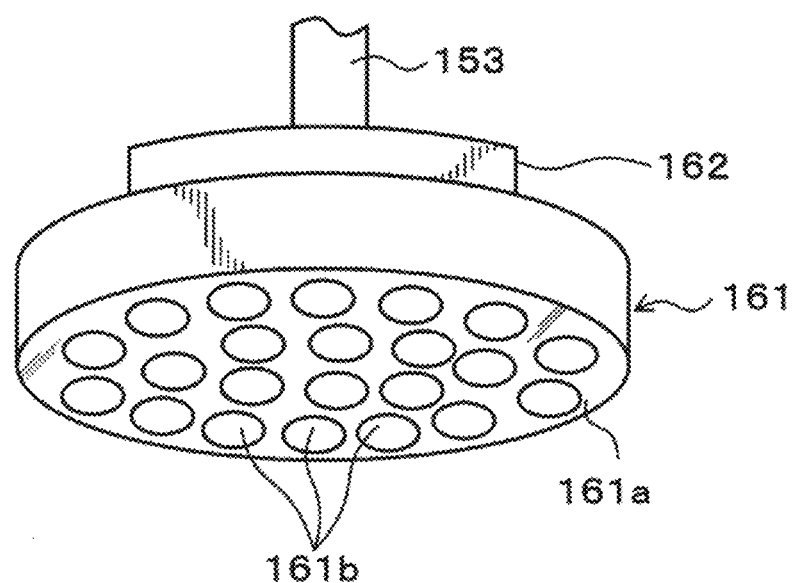
FIG. 22 is an explanatory view illustrating the schematic configuration of a developing solution supply nozzle according to still another embodiment.

In the embodiment described above, the supply hole 161b is formed only in the central portion of the developing solution supply nozzle 161. However, for example, as illustrated in FIG. 22, a plurality of supply holes 161b may be formed on the lower end surface 161a of the developing solution supply nozzle 161. By forming the plurality of supply holes 161b, it is possible to uniformly supply the developing solution Q or the diluted developing solution M to the lower end surface 161a.

Figure 23:
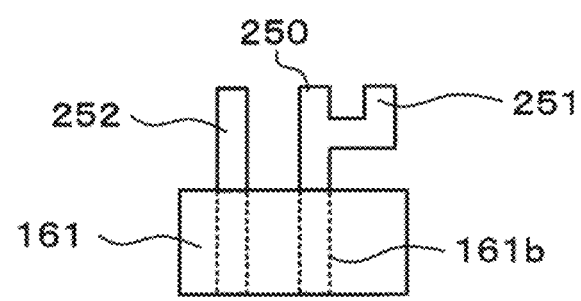
FIG. 23 is an explanatory view illustrating the schematic configuration of a developing solution supply nozzle according to still another embodiment.

In the embodiment described above, the pure water supply nozzle 154, the dilution-purpose developing solution supply nozzle 158 and the developing solution supply nozzle 161 are respectively supported by different arms 151, 152 and 153. However, the pure water supply nozzle 154, the dilution-purpose developing solution supply nozzle 158 and the developing solution supply nozzle 161 may be supported by a single arbitrary arm. In this case, for example, as illustrated in FIG. 23, a pure water pipe 252 for supplying the pure water P may be installed in the developing solution supply nozzle 161.

Figure 24:
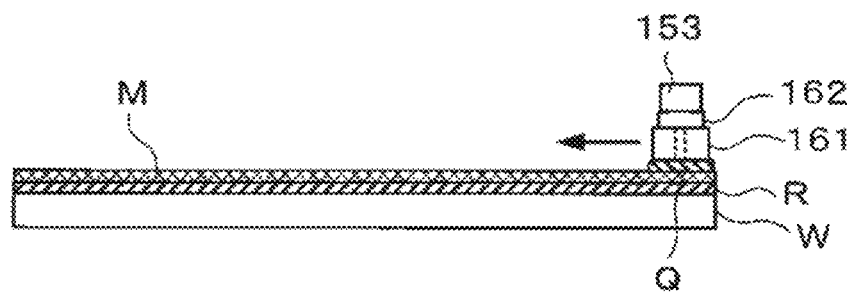
FIG. 24 is a vertical sectional explanatory view illustrating a state in which the developing solution supply nozzle is moved toward the central portion of the wafer while supplying the developing solution.
Figure 25:
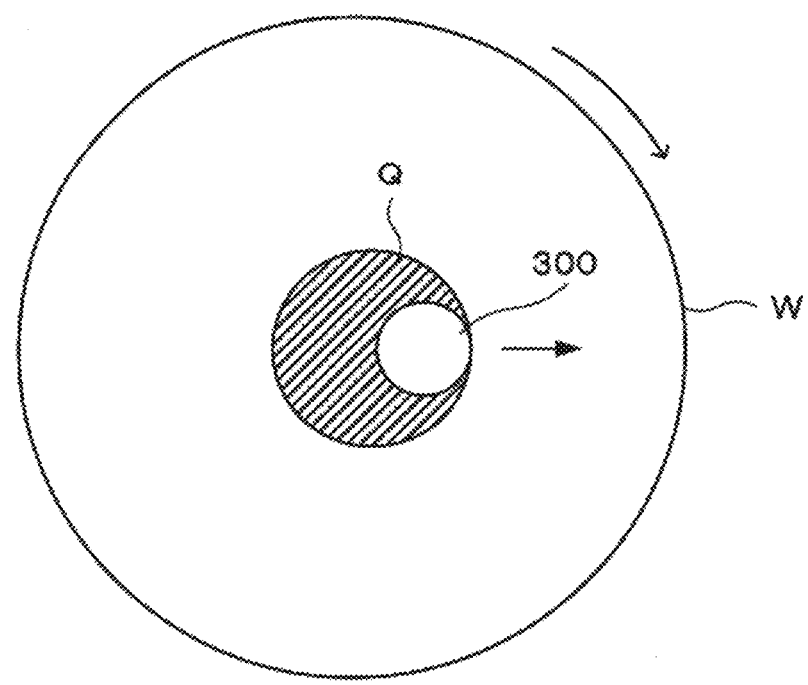
FIG. 25 is an explanatory plan view illustrating one example of developing method which makes use of a PAD nozzle.
Figure 26:
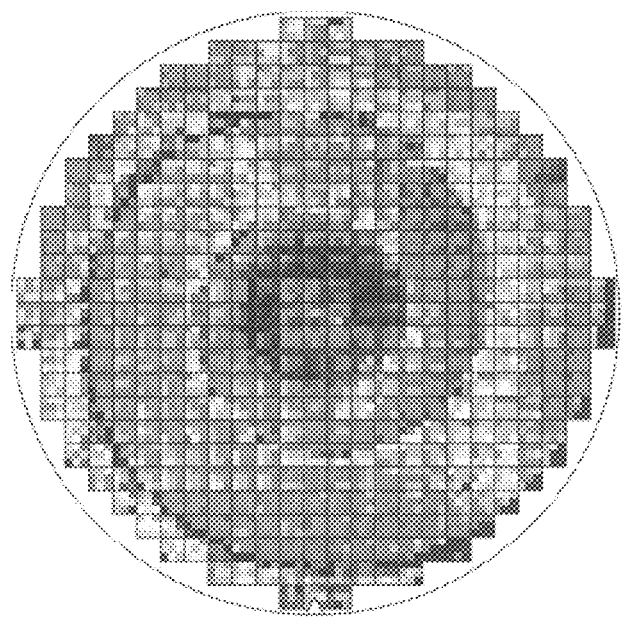
FIG. 26 is an explanatory view illustrating a variation in a line width of a resist pattern.

In the embodiment described above, at step T4, the developing solution Q is supplied from the developing solution supply nozzle 161 disposed at the central portion of the wafer W, thereby forming the liquid pool at the central portion of the wafer W. Thereafter, the developing solution supply nozzle 161 is moved from the central portion of the wafer W toward the outer peripheral end portion thereof while supplying the developing solution Q, thereby supplying the developing solution to the entire surface of the wafer W. However, the method of supplying the developing solution Q to the entire surface of the wafer W is not limited to the content of the present embodiment. For example, as illustrated in FIG. 24, the liquid pool of the developing solution Q may be formed in the outer peripheral end portion of the wafer W by the developing solution supply nozzle 161 at step T4. Thereafter, the developing solution supply nozzle 161 is moved to the central portion of the wafer W while supplying the developing solution Q, thereby supplying the developing solution Q to the entire surface of the wafer W. Even in this case, it is possible to develop the resist film R without being affected by the dissolved product U because the dissolved product U has already been discharged from above the wafer W together with the diluted developing solution M at step T3

According to the study conducted by the present inventors, it was confirmed that the in-plane uniformity of the developing process is improved by moving the developing solution supply nozzle 161 from the outer peripheral end portion of the wafer W toward the center portion thereof as illustrate in FIG. 24. The reason is supposed as follows. Since the dilution developing solution M is supplied to the center portion of the wafer W at step T3, a slight difference in the contact time with the diluted developing solution M is generated in the central portion of the wafer W and the outer peripheral portion thereof. Furthermore, the development occurs slightly by the developing solution M also. Therefore, the line width tends to become slightly thicker in the outer peripheral portion of the wafer W than in the central portion thereof. By forming the liquid pool of the developing solution Q in the outer peripheral end portion of the wafer W and then moving the developing solution supply nozzle 161 toward the central portion of the wafer W as illustrated in FIG. 24, the difference in the contact time with the diluted developing solution M, which is generated at step T3, is mitigated. Thus, it is supposed that the in-plane uniformity of the developing process is further improved.

According to the present disclosure in some embodiments, it is possible to improve the throughput of the developing process while securing the in-plane uniformity of the developing process.

While some preferred embodiments of the present disclosure have been described with reference to the accompanying drawings, the present invention is not limited to these embodiments. It will be apparent to those skilled in the art that different changes or modifications may be conceived without departing from the spirit of the present disclosure defined in the claims. It is to be understood that these changes or modifications may well fall within the technical scope of the present disclosure. The present disclosure is not limited to the aforementioned embodiments but may employ different forms. The present disclosure may be applied to a case where the substrate is a substrate other than the wafer, such as a flat panel display (FPD), a mask reticle for a photo mask or the like.

The present disclosure is useful when developing a resist film formed on a substrate.

What is claimed is:

1. A developing apparatus for supplying a developing solution onto a substrate and developing a resist film formed on the substrate and provided with a predetermined exposed pattern, comprising:
    a substrate holding part configured to hold a rear surface of the substrate and to rotate the held substrate about a vertical axis;
    a developing solution supply nozzle including a liquid contact surface and a supply hole configured to supply the developing solution to the liquid contact surface;
    a moving mechanism configured to move the developing solution supply nozzle;
    a pure water supply nozzle configured to supply pure water onto the substrate;
    another moving mechanism configured to move the pure water supply nozzle; and
    a controller configured to perform a control to: form a liquid pool of a diluted developing solution diluted with the pure water in a central portion of the substrate; after forming the liquid pool, form a liquid film of the diluted developing solution on a surface of the substrate by accelerating rotation of the substrate to diffuse the liquid pool of the diluted developing solution on the entire surface of the substrate; and after forming the liquid film, supply the developing solution onto the substrate by supplying the developing solution from the developing solution supply nozzle while securing a gap having a predetermined size between the developing solution supply nozzle and the substrate, and by moving the developing solution supply nozzle in a radial direction passing through a center of the substrate while forming a liquid pool of the developing solution between the substrate and the liquid contact surface of the developing solution supply nozzle,
    wherein the controller is further configured to accelerate the substrate to a first rotational speed when forming the liquid film of the diluted developing solution, and to move the developing solution supply nozzle from the central portion of the substrate to an outer peripheral portion of the substrate while rotating the substrate at a second rotational speed lower than the first rotational speed when supplying the developing solution, and
    wherein the controller is further configured to, when forming the liquid film of the diluted developing solution, accelerate the substrate, which is not rotating, to a third rotational speed lower than the first rotational speed, and then decelerate the substrate to a fourth rotational speed lower than the third rotational speed, and then accelerate the substrate to the first rotational speed.

2. A developing apparatus for supplying a developing solution onto a substrate and developing a resist film formed on the substrate and provided with a predetermined exposed pattern, comprising:

a substrate holding part configured to hold a rear surface of the substrate and to rotate the held substrate about a vertical axis;

a developing solution supply nozzle including a liquid contact surface and a supply hole configured to supply the developing solution to the liquid contact surface;

a moving mechanism configured to move the developing solution supply nozzle;

a diluted developing solution supply nozzle configured to supply a diluted developing solution onto the substrate;

another moving mechanism configured to move the diluted developing solution supply nozzle; and a controller configured to perform a control to: form a liquid pool of the diluted developing solution in a central portion of the substrate; after forming the liquid pool, form a liquid film of the diluted developing solution on a surface of the substrate by accelerating rotation of the substrate to diffuse the liquid pool of the diluted developing solution on the entire surface of the substrate; and after forming the liquid film, supply the developing solution onto the substrate by supplying the developing solution from the developing solution supply nozzle while securing a gap having a predetermined size between the developing solution supply nozzle and the substrate, and by moving the developing solution supply nozzle in a radial direction passing through a center of the substrate while forming a liquid pool of the developing solution between the substrate and the liquid contact surface of the developing solution supply nozzle, wherein the controller is further configured to accelerate the substrate to a first rotational speed when forming the liquid film of the diluted developing solution, and to move the developing solution supply nozzle from the central portion of the substrate to an outer peripheral portion of the substrate while rotating the substrate at a second rotational speed lower than the first rotational speed when supplying the developing solution, and wherein the controller is further configured to, when forming the liquid film of the diluted developing solution, accelerate the substrate, which is not rotating, to a third rotational speed lower than the first rotational speed, and then decelerate the substrate to a fourth rotational speed lower than the third rotational speed, and then accelerate the substrate to the first rotational speed.

3. The apparatus of claim 2, wherein the supply hole is shared by the developing solution supply nozzle and the diluted developing solution supply nozzle.

4. The apparatus of claim 1, further comprising a dilution-purpose developing solution supply nozzle configured to supply a dilution-purpose developing solution onto the substrate, wherein the controller is further configured to, when forming the liquid pool of the diluted developing solution, form a liquid pool of the pure water by supplying the pure water from the pure water supply nozzle to the central portion of the substrate which is not rotating, and then supply the dilution-purpose developing solution from the dilution-purpose developing solution supply nozzle onto the liquid pool of the pure water.

5. The apparatus of claim 2, wherein the controller is further configured to, when forming the liquid pool of the diluted developing solution, supply the diluted developing solution, which is diluted with the pure water in advance, from the diluted developing solution supply nozzle to the central portion of the substrate which is not rotating.

* * * * *